United States Patent
Arrowsmith et al.

[11] Patent Number: 6,112,064
[45] Date of Patent: Aug. 29, 2000

[54] RDS RADIO WITH MULTI-FUNCTION RDS BUTTON

[75] Inventors: Douglas Scott Arrowsmith, Milford; Latha Ravi, Farmington Hills; Douglas Brian Gillespie, Sterling Heights, all of Mich.

[73] Assignee: Thomson Consumer Electronics Sales, GmbH, Hannover, Germany

[21] Appl. No.: 08/920,146

[22] Filed: Aug. 26, 1997

[51] Int. Cl.[7] .................................................. H04B 1/18
[52] U.S. Cl. .................................. 455/186.1; 455/161.2; 455/166.2; 455/184.1
[58] Field of Search ................ 455/186.1, 161.2, 455/226.2, 185.1, 184.1, 186.2, 161.1, 166.2, 45, 345, 153.1, 161.3

[56] References Cited

U.S. PATENT DOCUMENTS

| | | | |
|---|---|---|---|
| 4,292,467 | 9/1981 | Odlen et al. | 381/1 |
| 4,461,026 | 7/1984 | Priniski | 381/98 |
| 4,706,294 | 11/1987 | Ouchida | 381/139 |
| 4,969,209 | 11/1990 | Schwob | 455/186.1 |
| 5,239,700 | 8/1993 | Guenther et al. | 455/158.4 |
| 5,241,696 | 8/1993 | Mori et al. | 455/186.2 |
| 5,406,626 | 4/1995 | Ryan | 380/9 |
| 5,471,389 | 11/1995 | Hahlganss | 364/424.05 |
| 5,537,673 | 7/1996 | Nagashima et al. | 455/346 |
| 5,548,828 | 8/1996 | Kozaki et al. | 455/161.2 |
| 5,603,108 | 2/1997 | Thoone | 455/226.2 |
| 5,757,860 | 5/1998 | Shiota | 455/186.1 |
| 5,842,119 | 11/1998 | Emerson et al. | 455/161.3 |

*Primary Examiner*—Dwayne D. Bost
*Assistant Examiner*—Tracy M. Legree
*Attorney, Agent, or Firm*—Joseph S. Tripoli; Robert D. Shedd

[57] ABSTRACT

A multi-function RDS button and a menu driven interface for accessing RDS features facilitates easy access to RDS functions with minimal demands upon the attention of the user. Large numbers of push buttons with cryptic labels and unintuitive push-button sequences of prior RDS radio receivers are avoided. Due to a long time-out period provided before automatically exiting the menu, the user can alternate attention between the radio and the road without losing their place in the menu or initiating an unwanted action.

9 Claims, 3 Drawing Sheets

6,112,064

RDS RADIO WITH MULTI-FUNCTION RDS BUTTON

BACKGROUND OF THE INVENTION

The present invention relates in general to radio data system (RDS) radio receivers, and more specifically to an improved user interface for accessing various RDS functions in the receiver.

Radio data systems such as the RDS system in Europe and the radio broadcast data system (RBDS) in the United States transmit auxiliary information within the radio broadcast to achieve various automatic functions of the receiver and to increase the utility of the receiver to a listener. The auxiliary information typically includes a traffic capable (TP) flag to identify broadcast stations which carry traffic announcements and a traffic announcement (TA) flag for identifying that a traffic announcement is currently being transmitted by the broadcast station. Other RDS flags are transmitted to identify emergency alert messages, news broadcasts, and weather announcements, for example. These flags allow a radio receiver to be automatically tuned to a broadcast station that provides traffic information for a driver of an automobile. In addition, a radio receiver can monitor a traffic capable station during times that the audio system is reproducing audio signals from a source other than a traffic capable radio station in order to automatically retune to the traffic announcement when one is present.

Another type of auxiliary information typically broadcasted includes a program type code or a program identification code that identifies a content type by which a broadcast station is operating (e.g., classical, rock, jazz, news, or even specific network programming). The program type (PTY) code allows a listener to seek or scan tune the radio receiver to a broadcast station of a particular program format.

In view of the many varied features which are facilitated by an RDS broadcast, the control panel for an RDS radio receiver becomes more complex than a standard radio receiver. The need for accessing a relatively large number of RDS features has resulted in radio receivers being cumbersome, and has required a listener to remember sequences of button presses to control the RDS features. Many prior art receivers have added additional push buttons to control various RDS features; however, space is limited, the additional button s increase costs, and additional buttons do not necessarily make a receiver easier to operate.

SUMMARY OF THE INVENTION

The present invention has the advantage that RDS features can be accessed in a simple and natural fashion while requiring fewer push buttons on the radio receiver control panel.

In one aspect of the invention, an RDS radio receiver has a control panel for adjusting function values of selected receiver functions. The receiver includes an alphanumeric display for displaying a current function value of a respective receiver function when the receiver is in a menu mode. A select button manually adjusts a function value corresponding to a receiver function currently being displayed. A multi-function RDS button is manually activated to cancel an RDS message in progress, to enter the menu mode, or to cycle between the receiver functions. Which one of these actions that results from a manual activation of the RDS button is determined in response to a current operating state of the receiver.

DETAILED DESCRIPTION OF PREFERRED EMBODIMENTS

Figure 1:
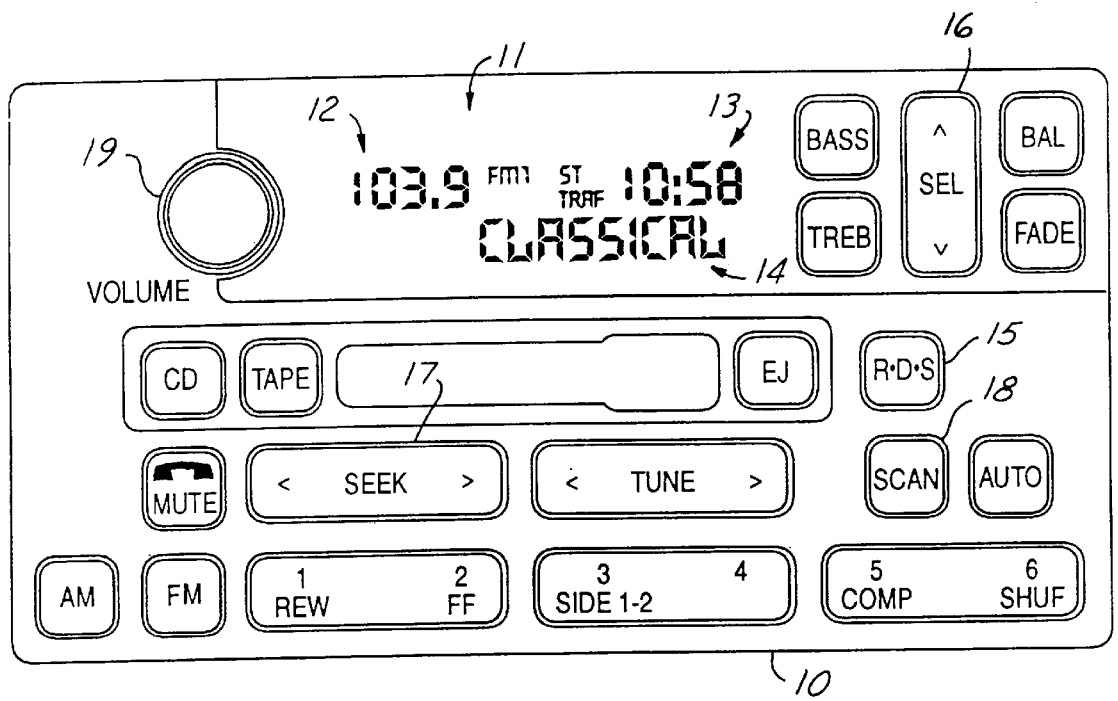
FIG. 1 is a front plan view of a radio control panel according to the present invention.

FIG. 1 shows a radio control panel 10 including an alpha numeric display 11. A vacuum florescent, segmented display may typically be used. Various display areas are provided for displaying the tuner frequency at 12, clock time at 13, and a line of text at 14 (in this example, the text line includes the word "classical").

Control panel 10 includes a number of push buttons that are relevant to RDS radio receiver operation including an RDS button 15, an up/down select toggle switch 16, an up/down seek toggle switch 17, a scan button 18, and a volume control knob 19. Use of the various push buttons in accessing various RDS functions will be described below.

Figure 2:
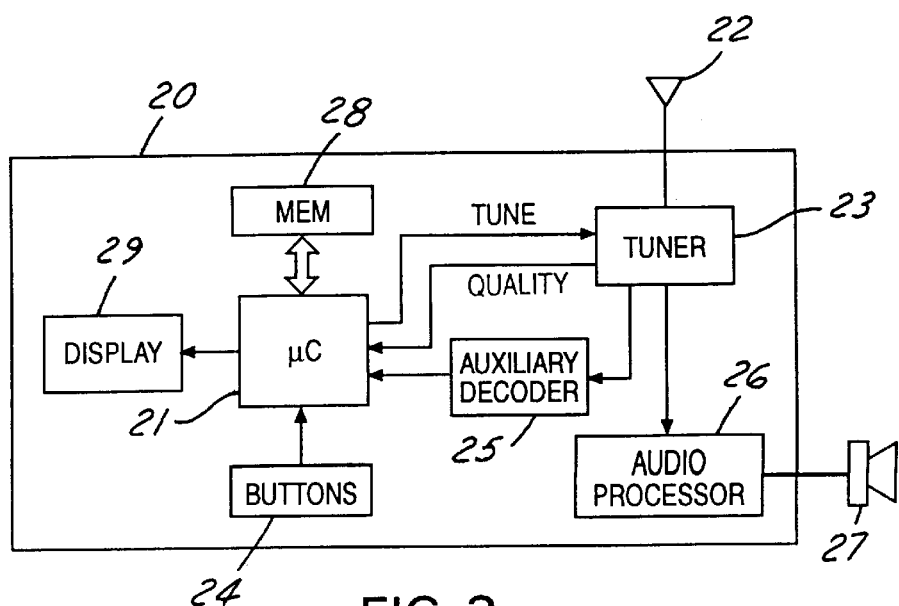
FIG. 2 is a schematic block diagram showing elements of a radio receiver according to the present invention.

As shown in FIG. 2, an RDS or RBDS radio receiver 20 operates under control of a microcontroller 21. Radio broadcast signals are picked up by an antenna 22 and relayed to a tuner 23 which is controlled by microcontroller 21. A tune signal from microcontroller 21 commands the frequency to which tuner 23 tunes. The user can control the frequency through buttons 24. If a received radio broadcast signal is an RDS or RBDS signal including auxiliary data, then the auxiliary data is removed from the radio signal by an auxiliary decoder 25 connected between tuner 23 and microcontroller 21. Tuner 23 provides a quality signal to microcontroller 21 which identifies the signal strength or other quality measure of a broadcast signal being received. Audio signals from tuner 23 are processed through an audio processor 26 before being reproduced by a speaker 27. Microcontroller 21 is also connected to a memory 28 and to an alphanumeric display 29. The particular method of operating display 29 in conjunction with buttons 24 provides the user interface which is the subject of the present invention.

According to one aspect of the invention, RDS button 15 is a multi-function button which performs different tasks depending upon the current operating state of the receiver. By pressing and holding RDS button 15 for longer than a predetermined time (e.g., 3 seconds), the radio receiver toggles on or off all RDS functions simultaneously, such as traffic announcements, alternate frequency searching, or others. During the execution of an automatic RDS function (such as the automatic switching to a traffic announcement or an emergency alert message), RDS button 15 is used to cancel the automatic function. RDS button 15 is also used in the present invention to enter a menu mode in which various RDS receiver functions can be controlled.

Figure 3:
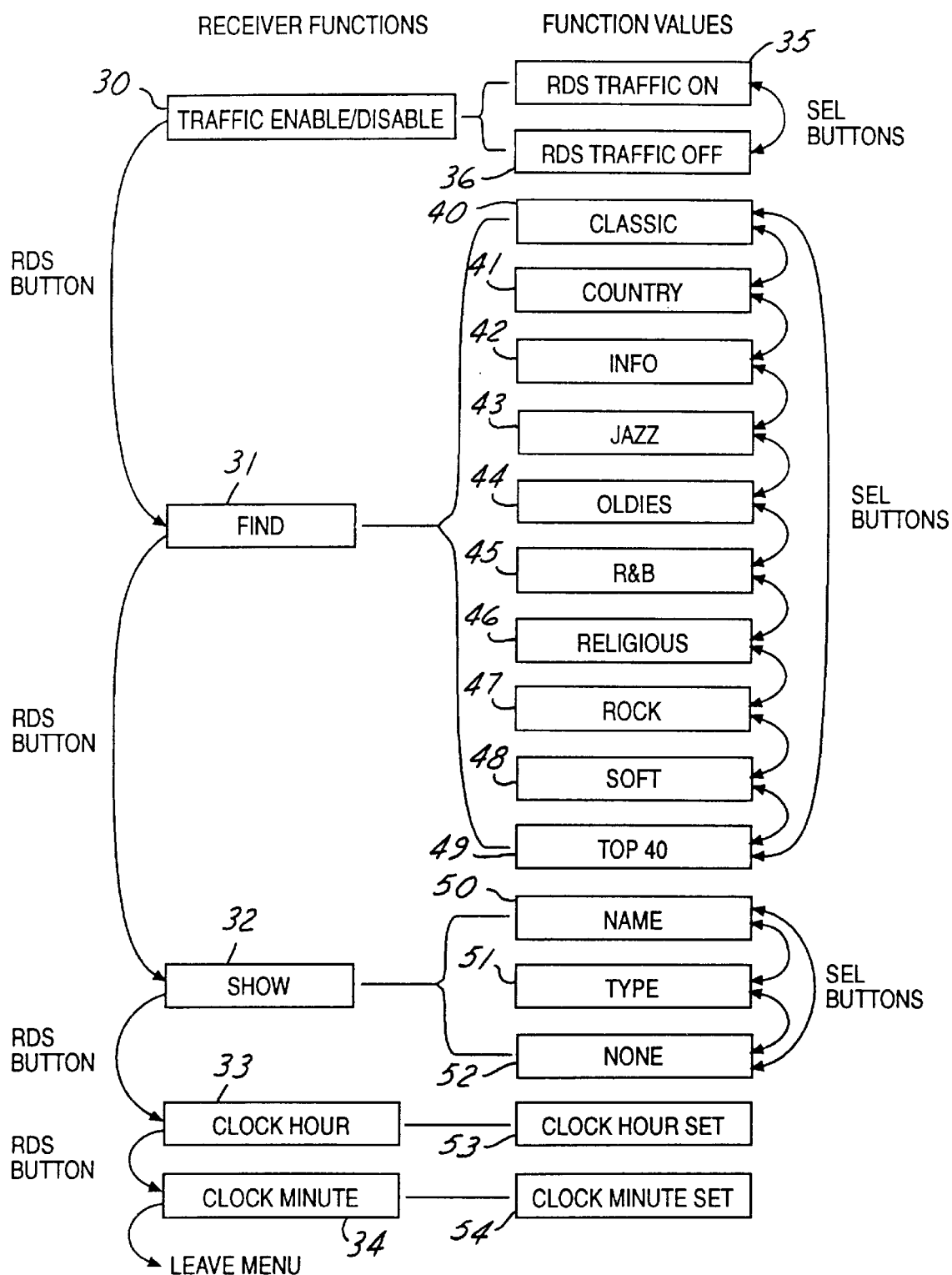
FIG. 3 shows a schematic diagram of the menu interface according to the present invention.

A preferred structure for the menu of the present invention is shown in FIG. 3. The menu is organized into separate receiver functions, each of which has various function values which may be selected. Preferably, whenever a particular receiver function is accessed, the currently set function value is shown on the control panel display. The function values can be changed using the select toggle switch. Certain RDS actions can also be initiated while in the menu mode by activating an "action control" such as the seek or scan buttons or the volume control knob.

FIG. 3 shows the menu structure of the present invention. A plurality of receiver functions can be sequentially accessed in the menu by pressing the RDS button. The receiver functions are presented within the menu substantially in order of frequency of use so that the most used functions are presented first. Since various conditions may impact which receiver functions are most likely to be used, these conditions can be sensed and the menu order of functions changed depending upon the instantaneous state of the receiver.

FIG. 3 shows the most typical order of receiver functions wherein the first adjustable receiver function is traffic enable/disable in box 30. By depressing the RDS button, the next receiver function of the menu can be accessed, which is the FIND function at box 31. A SHOW menu item 32, a clock hour menu item 33, and clock minute menu item 34 can be accessed by subsequent activations of the RDS button. A further activation of the RDS button causes the receiver to leave the menu mode.

Each receiver function has respective function values that are adjusted through the select ("SEL") toggle buttons. Preferably, the receiver function that can be adjusted at any time in the menu mode is indicated by displaying the current setting of its function value. Thus, in the traffic enable/disable receiver function, a displayed message of either "RDS traffic on" as shown in box 35, or "RDS traffic off" as shown in box 36 is displayed on the display depending upon whether the function to automatically tuned to traffic announcements is enabled or disabled. When the select buttons are used to alter the function value, the display is immediately updated and the new traffic enable/disable status may take effect either immediately upon pressing the select button, or when the menu is no longer in the mode to adjust traffic enable/disable status (e.g., when the next receiver function menu item is accessed or after a time-out period).

The FIND receiver function allows a listener to search through broadcast stations for a station of a particular format as defined by the RDS program type code PTY. Program types are show in FIG. 3 boxes 40–49, each of which may correspond to one or more RDS PTY codes. Due to the large number of PTY codes, it simplifies use of the receiver to provide a reduced number of groups as shown. When a desired program type is shown in the display, the user can activate the FIND function by pressing a seek button or the scan button. When a seek button is pressed, the band is swept from the currently tuned frequency in the direction of the desired seek until a broadcast is found satisfying the program type code and having a sufficient signal strength to be listenable. The tuner remains at the found frequency until further action by the listener. When the FIND function is instead initiated via the scan button, the tuner remains at each found broadcast for an audition period (e.g., 6 seconds) and then moves on to find another valid broadcast station. When an end of band is reached, the tuner changes to the opposite end of the band and continues the FIND function.

The SHOW receiver function allows the listener to select which RDS information if any will be displayed on the radio status display when an RDS station is tuned. Initially, the display shows the current information display option that is selected. Choices include displaying 1) the program service name which is transmitted in a particular field within the RDS auxiliary data, 2) the current program type, or 3) no RDS information (i.e., a blank display section). Since broadcasters may be allowed the transmit any information in the portion of the auxiliary data format reserved for program service name, it is desirable to allow blanking of this information in the event that the user does not wish to display it.

For the receiver functions corresponding to setting the clock hour and clock minute, the display shows a "clock hour set" or "clock minute set" message, respectively, and hours and minutes can be set using the select buttons with the hours and minutes being updated on the clock display.

Figure 4:
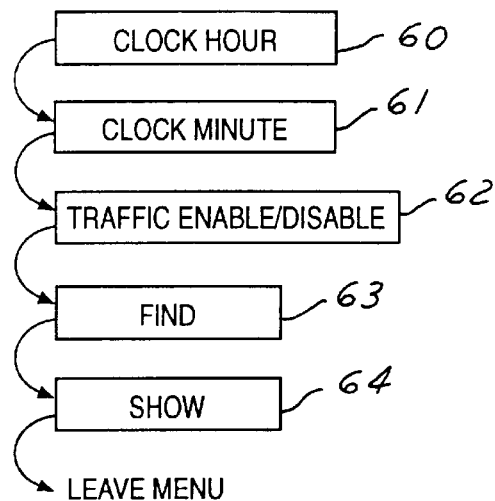
FIG. 4 shows an alternate order of menu items depending upon the operating state of the receiver.

In the event that the clock has not had its hours and minutes set since electrical power was first applied to the radio receiver, then the clock can be expected to be inaccurate and the likelihood of the user wanting to reset the clock is increased. Therefore, the order of receiver functions in the menu can preferably be changed whenever the clock has not been set since the application of power as shown in FIG. 4. Thus, the new menu order under this operating state is comprised of clock hour 33, clock minute 34, traffic enable/disable 30, FIND 31 and SHOW 32.

Whenever an alternate media such as cassette tape or CD player is being reproduced by the radio receiver, the menu order of receiver functions is preferably further altered by deleting functions which are not then relevant such as FIND and SHOW.

Figure 5:
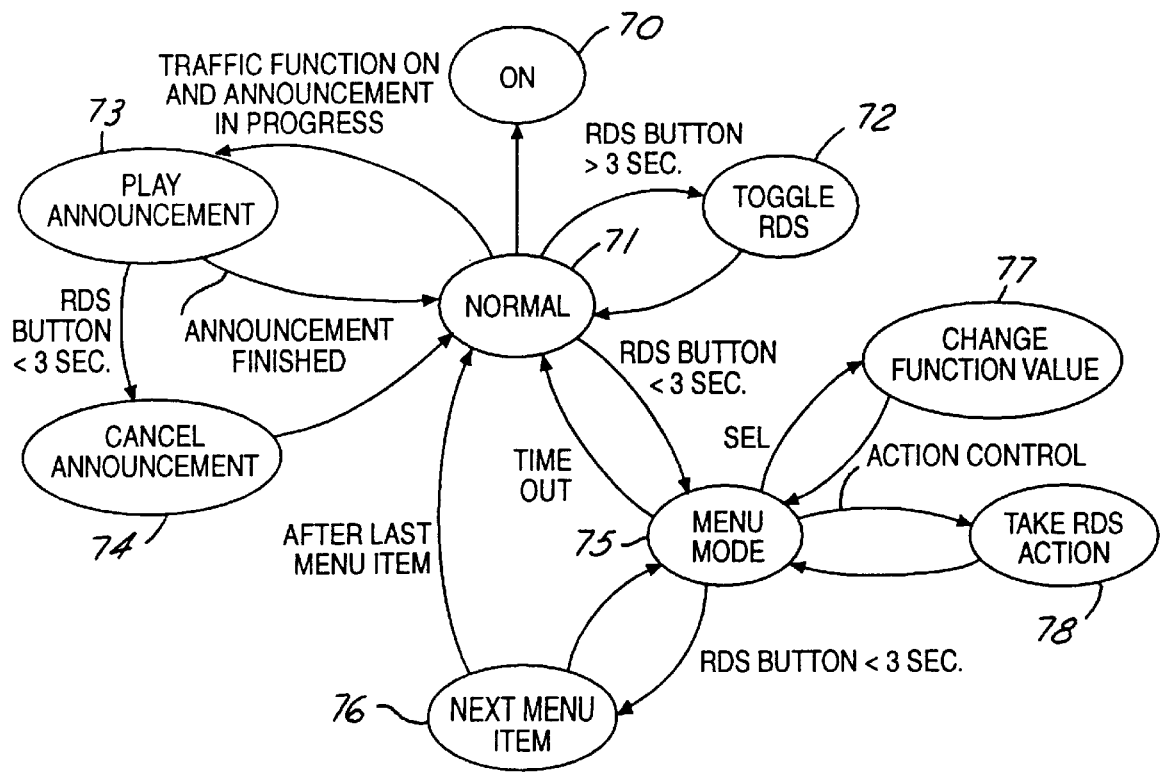
FIG. 5 is a state diagram illustrating the various functions performed by the RDS button depending upon the current operating state of the receiver.

The operation of the present invention will be further described in connection with the state diagram shown in FIG. 5. After the radio receiver is turned on at state 70, it proceeds to a normal operating state 71. In response to a depression of the RDS button for greater than 3 seconds, the radio receiver toggles the enabled or disabled status of all RDS features in state 72 and then returns to normal state 71.

Whenever in the normal state 71 with traffic functions on or enabled but while not listening to the RDS traffic broadcast, then if an RDS station being monitored begins carrying an RDS flag indicating that a traffic announcement is in progress, then the radio receiver enters a state 73 wherein the traffic announcement is automatically reproduced or played. Upon the termination of the traffic announcement, the receiver restores the previous audio source and reverts to normal state 71. If during the playing of an announcement, the RDS button is depressed, then the further playback of the announcement is canceled in state 74 and the receiver immediately returns to normal state 71. The receiver may operate in a similar manner for other types of announcements such as emergency alerts.

If the RDS button is depressed for less than 3 seconds while in normal state 71, the menu mode is entered at state 75. If there is no activity on any radio receiver controls for a time-out period of about 10 seconds, then the receiver returns to normal state 71. While in menu mode state 75, activation of the RDS button for less than 3 seconds causes the receiver to increment to the next menu item of receiver functions, and then the receiver returns to menu mode state 75, except when the last menu item has been displayed, in which case the receiver returns to normal state 71.

While in menu mode state 75, each depression of the SEL buttons causes the receiver to enter state 77 where function values are changed in accordance with the order shown in FIG. 3. After the function value is changed, the receiver returns to menu mode state 75. When an action control is activated (e.g., depression of a seek or scan button or adjustment of the volume knob), the appropriate RDS action is taken in step 78, and then the receiver returns to menu mode state 75. The volume knob is used to adjust the volume level used during traffic announcement reproduction, for example.

As a result of the interface and control arrangement of the present invention, a simple and natural manner of accessing RDS functions has been provided for the radio user. Only a few buttons are required on the control panel, yet each individual function can be accessed with a relatively small number of button presses. By adopting a relatively long time-out period for exiting the menu, operation by a driver of a motor vehicle is facilitated. The menu prompts shown in the display further reduce the burdens placed upon the user to remember either long button sequences or the functions corresponding to a large number of push buttons.

What is claimed is:

1. An RDS radio receiver with a control panel for adjusting function values of selected receiver functions, said RDS radio receiver comprising:

an alphanumeric display displaying a current function value of a respective receiver function when said receiver is in a menu mode;

a select button for manually adjusting a function value corresponding to a receiver function currently being displayed; and a multifunction RDS button which when manually activated results in the selection of one of the following predetermined actions: to cancel an RDS message in progress, to enter said menu mode, or to cycle between said receiver functions, wherein the one of said actions is determined in response to a current operating state of said receiver.

2. The RDS radio receiver of claim 1 wherein said receiver functions are presented in a predetermined sequence when cycling via said multifunction RDS button, said predetermined sequence providing the most frequently used receiver functions at its beginning and having an order which varies according to a current operating state of said receiver that may affect which receiver functions would be used most frequently.

3. The RDS radio receiver of claim 2 wherein said predetermined sequence is comprised of the ordered functions of 1) toggling traffic announcements, 2) finding an RDS format, 3) setting display information mode, and 4) setting clock time whenever radio broadcasts are being reproduced and the clock has previously been set.

4. The RDS radio receiver of claim 2 wherein said predetermined sequence is comprised of the ordered functions of 1) setting clock time, 2) toggling traffic announcements, 3) finding an multifunction RDS format, and 4) setting display information mode whenever radio broadcasts are being reproduced and the clock has not been previously set since electrical power was applied to said radio receiver.

5. The RDS radio receiver of claim 1 wherein said multifunction RDS button is used to toggle all RDS functions on or off simultaneously by pressing and holding said RDS button for greater than a predetermined length of time.

6. The RDS radio receiver of claim 5 wherein said predetermined length of time is about three seconds.

7. The RDS radio receiver of claim 1 wherein said menu mode is exited if there is no control activity on said control panel for a predetermined time-out period.

8. The RDS radio receiver of claim 1 wherein one of said receiver functions in said menu mode is comprised of setting a display information mode which includes function values comprised of a station service name and a blank display.

9. The RDS radio receiver of claim 8 wherein said function values further comprise a program-type name.

* * * * *